United States Patent
Chung

(10) Patent No.: US 7,482,200 B2
(45) Date of Patent: Jan. 27, 2009

(54) PROCESS FOR FABRICATING CHIP PACKAGE STRUCTURE

(75) Inventor: Chih-Ming Chung, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 8 days.

(21) Appl. No.: 11/778,659

(22) Filed: Jul. 17, 2007

(65) Prior Publication Data

US 2007/0259481 A1 Nov. 8, 2007

Related U.S. Application Data

(62) Division of application No. 11/160,924, filed on Jul. 15, 2005, now Pat. No. 7,262,510.

(30) Foreign Application Priority Data

Jul. 30, 2004 (TW) .............................. 93122841 A

(51) Int. Cl.
*H01L 21/00* (2006.01)
(52) U.S. Cl. ..................... 438/108; 438/613; 438/614; 257/E21.511
(58) Field of Classification Search ................ 438/108
See application file for complete search history.

(56) References Cited

U.S. PATENT DOCUMENTS

| | | | | |
|---|---|---|---|---|
| 5,633,535 A | * | 5/1997 | Chao et al. | 257/778 |
| 5,956,605 A | * | 9/1999 | Akram et al. | 438/613 |
| 6,201,301 B1 | * | 3/2001 | Hoang | 257/712 |
| 6,213,347 B1 | * | 4/2001 | Thomas | 222/52 |
| 6,228,680 B1 | * | 5/2001 | Thomas | 438/108 |
| 6,245,583 B1 | * | 6/2001 | Amador et al. | 438/14 |
| 6,372,544 B1 | * | 4/2002 | Halderman et al. | 438/108 |
| 6,518,677 B1 | * | 2/2003 | Capote et al. | 257/783 |
| 6,673,649 B1 | * | 1/2004 | Hiatt et al. | 438/105 |
| 6,696,644 B1 | * | 2/2004 | Chiu et al. | 174/535 |
| 6,791,195 B2 | * | 9/2004 | Urushima | 257/783 |
| 2001/0013653 A1 | * | 8/2001 | Shoji | 257/738 |
| 2004/0027788 A1 | * | 2/2004 | Chiu et al. | 361/329 |
| 2004/0087057 A1 | * | 5/2004 | Wang et al. | 438/106 |
| 2004/0149479 A1 | * | 8/2004 | Chiu et al. | 174/52.2 |
| 2004/0262778 A1 | * | 12/2004 | Hua | 257/778 |
| 2005/0006789 A1 | * | 1/2005 | Tomono et al. | 257/778 |
| 2005/0126927 A1 | * | 6/2005 | Lindauer et al. | 205/743 |
| 2005/0277231 A1 | * | 12/2005 | Hembree et al. | 438/127 |
| 2006/0115931 A1 | * | 6/2006 | Hsu | 438/121 |

* cited by examiner

*Primary Examiner*—David A Zarneke
(74) *Attorney, Agent, or Firm*—Jianq Chyun IP Office

(57) ABSTRACT

A process for fabricating a chip package structure with the following steps is provided. First, a chip having an active surface is provided. A plurality of solder bumps is disposed on the active surface. Then, a polymer material including flux is placed on the surface of the solder bumps by a dipping process. The chip is disposed on a carrier such that the carrier is in contact with the solder bumps. A reflow process is carried out so that the chip and the carrier are electrically connected through the solder bumps and a plurality of supporting structures made from the polymer material are formed around the junctions between the solder bumps and the carrier. The supporting structures enhance the endurance of the solder bumps to thermal stress and reduce damage due to fatigue.

7 Claims, 3 Drawing Sheets

PROCESS FOR FABRICATING CHIP PACKAGE STRUCTURE

CROSS-REFERENCE TO RELATED APPLICATION

This application is a divisional of a prior application Ser. No. 11/160,924, filed on Jul. 15, 2005, now allowed, which claims the priority benefit of Taiwan application serial no. 93122841, filed on Jul. 30, 2004. The entirety of each of the above-mentioned patent applications is incorporated herein by reference.

BACKGROUND OF THE INVENTION

1. Field of the Invention

The present invention relates to a chip package structure and a fabricating method thereof. More particularly, the present invention relates to a flip chip bonded chip package structure and a process for fabricating the same.

2. Description of the Related Art

As the need for communication is increasingly important in our society, the market for various types of electronic devices expands rapidly. To prepare for the upcoming trend, chip packages often have a design that reflects our need for a digital network connection and more personalized electronic equipment. One way of meeting our demands is to produce highly integrated digital devices having higher processing speed and more powerful functions, a lighter body and yet cheaper to produce. In other words, chip packages continue to improve through miniaturization and increasing its packing density. In the flip chip bonding technique of fabricating chip packages, bumps are used to connect a chip with a carrier. Since the flip chip bonding technique has a much shorter wiring length relative to a conventional wire bonded package, signal transmission between the chip and the carrier is significantly increased. As a result, flip chip packages have gradually become one of the most widely adopted high-density package products.

FIG. 1 is a schematic cross-sectional view of a conventional flip chip package. As shown in FIG. 1, the chip package 40 comprises a chip 50 having an active surface 52, a carrier 80 and a plurality of bumps 60. The active surface 52 has a plurality of bonding pads 54 thereon. The surface of the carrier 80 has a plurality of contacts 84. The bumps 60 are disposed on the bonding pads 54 of the chip 50. The chip 50 and the carrier 80 are electrically connected through the bonding pads 54, the bumps 60 and the contacts 84 on the carrier 80.

To protect the chip 50 against damage due to the infiltration of moisture and the bumps 60 linking the chip 50 and the carrier 80 against physical damage due to mechanical stress, an underfill layer 70 often fills the gap between the chip 50 and the carrier 80. However, due to the difference in coefficient of thermal expansion (CTE) between the chip 50, the bumps 60, the underfill layer 70 and the carrier 80, the chip package 40 is vulnerable to thermal stress failure resulting from cyclic temperature variations due to repeated operation.

In general, the thermal stress induced by a difference in coefficient of thermal expansion is frequently concentrated in areas close to the junction between the bump and the carrier. Since cyclic stress in these areas can cause fatigue, cracks may propagate inside the bumps. Ultimately, the reliability of the electrical connection between the chip and the carrier will be compromised. One way to resolve this problem is to increase the area of contact between the bump and the contact and reduce thermal stress concentration. Yet, increasing the contact area must be accompanied by a corresponding increase in the pitch separating adjacent contacts to reduce the probability of having an abnormal electrical connection between the neighboring bumps. The prevention of abnormal connection between neighboring bumps also limits the number of contacts that can be disposed between a given chip and carrier. Furthermore, increasing the area of contact between the bumps and the contacts will lower the average height of the bumps and subject the bumps to a higher thermal stress.

In brief, a high priority is placed on finding a method capable of reducing as much damage to the bumps as possible due to a difference in the coefficient of thermal expansion between the chip, the bumps, the underfill layer and the carrier of a chip package.

SUMMARY OF THE INVENTION

Accordingly, at least one objective of the present invention is to provide a chip packaging process capable of reducing fatigue failure due to a difference in coefficient of thermal expansion between various materials constituting the chip package.

At least a second objective of the present invention is to provide a chip package structure capable of reducing fatigue failure due to a difference in coefficient of thermal expansion between various materials constituting the chip package.

To achieve these and other advantages and in accordance with the purpose of the invention, as embodied and broadly described herein, the invention provides a chip packaging process comprising the following steps. First, a chip having an active surface with a plurality of solder bumps disposed thereon is provided. Then, a polymer material including flux is placed on the surface of the solder bumps by a dipping process. The chip is disposed on a carrier such that the carrier is in contact with the solder bumps. A reflow process is carried out so that the chip and the carrier are electrically connected through the solder bumps and a plurality of supporting structures made from the polymer material is formed around the junctions between the solder bumps and the carrier.

After performing the reflow process, the present embodiment may include forming an underfill layer between the chip and the carrier. In addition, a curing process may be carried out to strengthen the supporting structures after the reflow process. The dipping process for placing the polymer material on the surfaces of the solder bumps may include providing a vessel filled with the polymer material and dipping the chip into the vessel with the active surface facing down. Thus, the polymer material is adhered to the surface of the solder bumps. Otherwise, the polymer material may adhered to the top surfaces of the solder bumps. The shapes of the solder bumps comprise spherical or cylindrical shapes. Furthermore, an array of solder balls may be formed on the surface of the carrier away from the chip after forming the supporting structures. In addition, the solder bumps may be transformed into a plurality of spherical bumps between the chip and the carrier after the reflow process.

The present invention also provides a chip package structure comprising a carrier, a plurality of bumps, a chip and a plurality of supporting structures. The bumps are disposed on the carrier. The chip has an active surface. The active surface of the chip is flip-chip bonded and electrically connected to the carrier through the bumps. The supporting structures are disposed around the junctions between the bumps and the carrier.

The chip package of the present embodiment may further comprise an underfill layer filled the gap between the chip and the carrier. The underfill layer is fabricated using a material different from the material constituting the supporting structures. The supporting structures are fabricated from an epoxy resin or other polymer material, for example. The aforementioned supporting structures are isolated and independent entities, for example. The chip package may also comprise an array of solder balls disposed on the surface of the carrier away from the chip. In addition, the carrier can be a printed circuit board.

Accordingly, the chip packaging process of the present invention includes the step of forming a plurality of supporting structures around the junctions between the bumps and the carrier. Thus, the bumps can have a higher tolerance for thermal stress and the electrical connection between the chip and the carrier can have a greater reliability. Ultimately, the number of contacts between a chip and a carrier can be increased to produce a chip package with a higher packing density.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
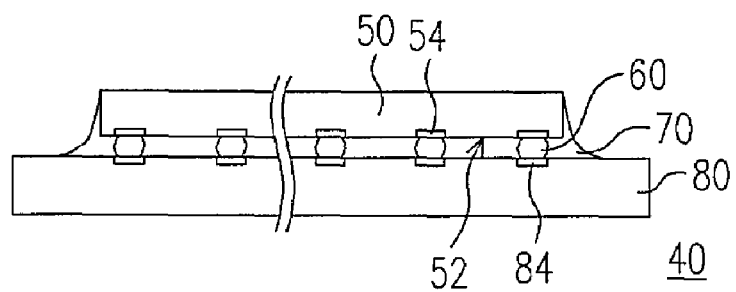
FIG. 1 is a schematic cross-sectional view of a conventional flip chip package.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
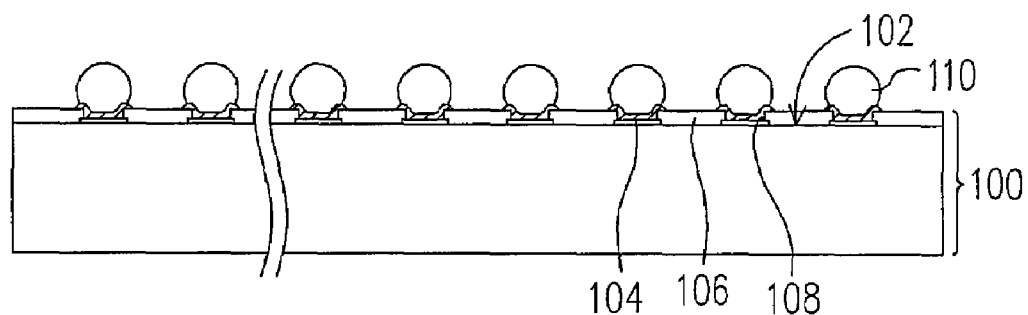
FIGS. 2A through 2F are schematic cross-sectional views showing the steps for producing a chip package according to one preferred embodiment of the present invention.

FIGS. 2A through 2F are schematic cross-sectional views showing the steps for producing a chip package according to one preferred embodiment of the present invention. As shown in FIG. 2A, a chip 100 having an active surface 102 is provided. The active surface 102 has a plurality of solder bumps 110 disposed thereon. The active surface 102 of the chip 100 also includes a plurality of bonding pads 104 and a passivation layer 106. The passivation layer 106 protects the chip 100 but exposes the bonding pads 104. The solder bumps 110 are disposed on the bonding pads 104. Furthermore, an under bump metallurgy (UMB) 108 is also disposed between each bonding pad 104 and a corresponding solder bump 110. The UMB 108 formed with patterned metal layer increases the reliability of bonding between the bonding pad 104 and the solder bump 110 and serves as a barrier to prevent any contaminant material in the solder bump 110 from diffusing into the chip via the bonding pad 104. In addition, the UBM layer 108 also reduces the rate of production of intermetallic compound between the bonding pad 104 and the solder bump 110. The solder bumps 110 have a spherical or cylindrical shape, for example. The solder bumps 110 are formed, for example, by performing a stencil printing or an electroplating operation followed by an optional reflow process. Typically, the solder bumps 110 are fabricated from gold, lead-tin solder material or lead free solder material.

Figure 2B:
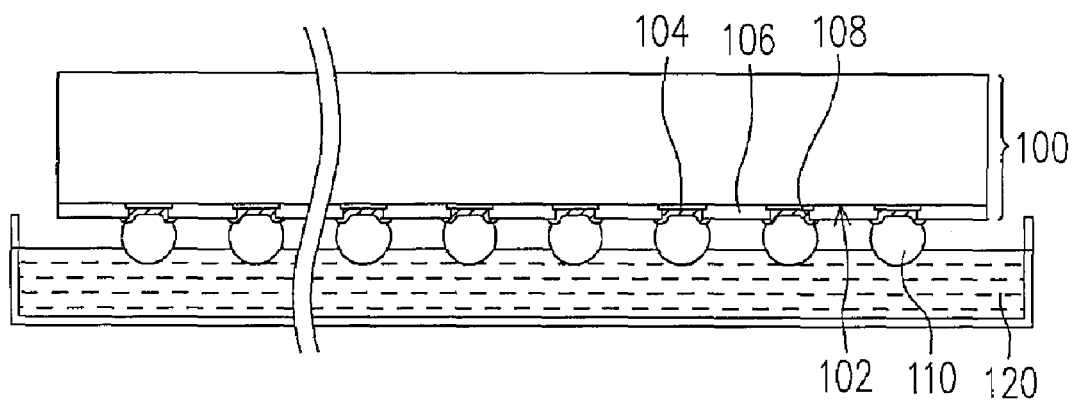
Figure 2C:
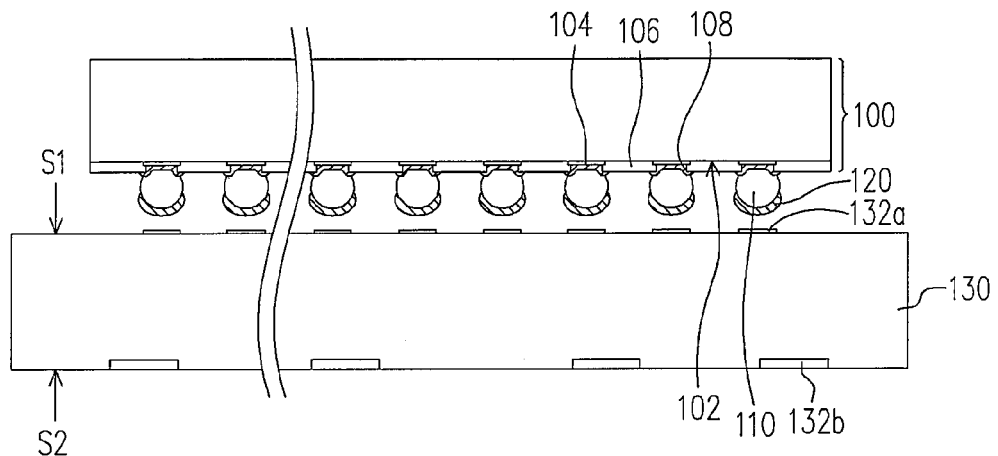

As shown in FIGS. 2B and 2C, a dipping process is carried out to place a polymer material 120 on the surface of the solder bumps 110. The polymer material 120 adheres to the top surface of the solder bumps 110, for example. The polymer material 120 contains flux for strengthening the adhesion of the solder bumps 110 in a subsequent bonding process. The polymer material 120 is, for example, composed of epoxy resin or other polymeric compound. The dipping process for placing the polymer material on the surface of the solder bumps 110 may include providing a vessel filled with a polymer material 120 (as shown in FIG. 2B). Thereafter, with the active surface 102 of the chip 100 facing down, the chip 100 is lowered into the polymer material 120 so that the polymer material 120 is adhered to the surface of the solder bumps 110 (as shown in FIG. 2C). After that, the chip 100 is lifted away from the vessel with the active surface 102 of the chip 100 still facing downward to prevent the polymer material 120 from flowing on the active surface 102.

Figure 2D:
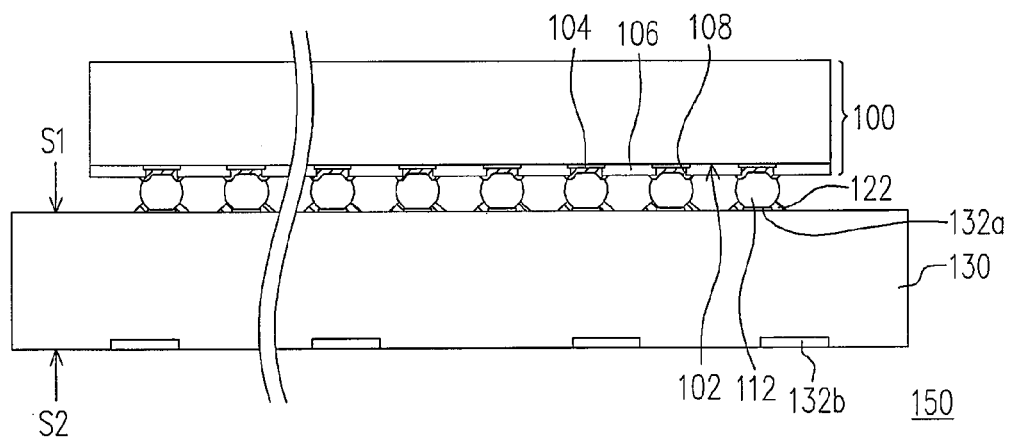

As shown in FIG. 2D, the chip 100 is disposed on a carrier 130. The carrier 130 is a packaging substrate such as a printed circuit board. The carrier 130 has a first surface S1 and a second surface S2. The first surface S1 has a plurality of first contacts 132a and the second surface S2 has a plurality of second contacts 132b. The solder bumps 110 on the chip 100 make contact with the contacts 132a on the carrier 130. Since the polymer material 120 is in a liquid state, the solder bumps 110 can make a direct contact with the contacts 132a. Thereafter, a reflow process is carried out to melt the solder bumps 110 so that the chip 100 and the carrier 130 are electrically connected through the solder bumps 110. Because the polymer material 120 contains flux, the bumps 112 can form a good electrical connection with the contacts 132a after the reflow process. Furthermore, due to the high temperature in the reflow process, the solvent is bled out from the polymer material 120 to produce a plurality of supporting structures 122 around the junctions between the bumps 112 and the carrier 130. Obviously, an additional curing process may be carried out after the reflow process to form the supporting structures 122 according to the actual material constituting the polymer material 120. Up to this point, all the steps for forming a chip package 150 are almost completed.

Each supporting structure 122 is formed around the junction between a bump 112 and the carrier 130. Although each supporting structure 122 encircles the bottom edge of the bump 112, the supporting structures 122 are detached from each other. In the presence of the supporting structures 122, the junction areas between the bumps 112 and the carrier 130 are strengthened. Hence, the bumps 112 can tolerate a higher thermal stress that results from a difference in the coefficient of thermal expansion between the chip 110 and the carrier 130. In the meantime, the probability of the bumps 112 having a fatigue failure of the bumps 112 due to the cyclic temperature variation of the chip package 150 in operation is substantially reduced.

Figure 2E:
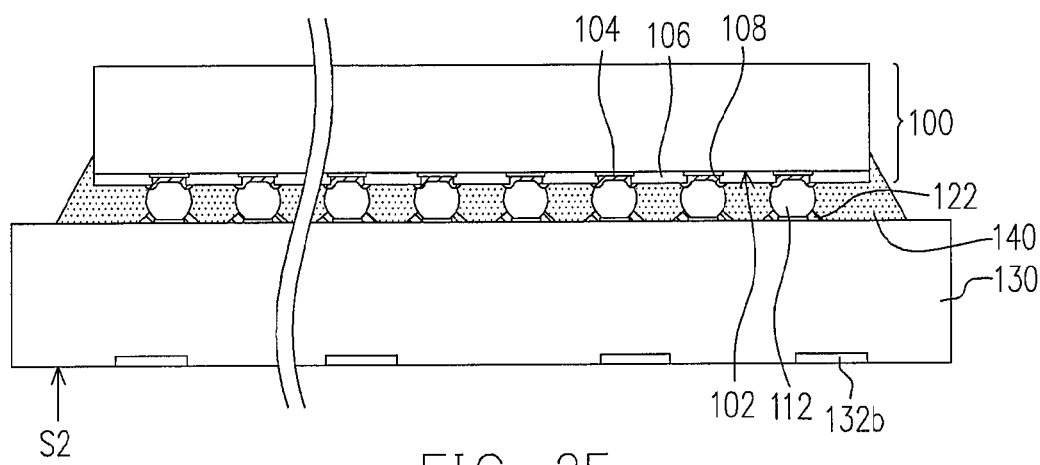

As shown in FIG. 2E, an underfill layer 140 can be formed in the gap between the chip 100 and the carrier 130. Obviously, the underfill layer 140 may also cover the back surface of the chip 100 as well (not shown). The underfill layer 140 is typically fabricated using a material different from the supporting structures 122.

Figure 2F:
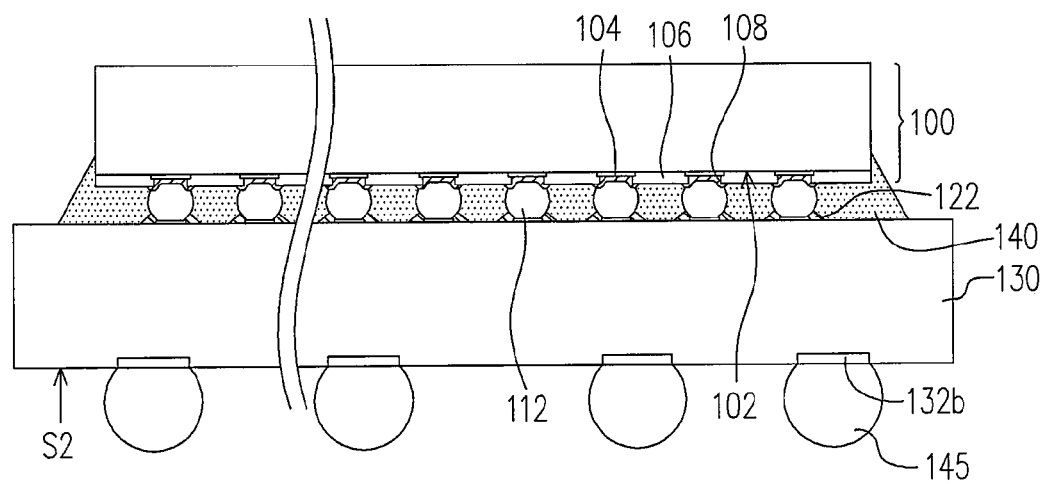

As shown in FIG. 2F, an array of solder balls 145 is formed on the contacts 132b on the second surface S2 of the carrier 130 for electrically connecting with other devices or carrier board.

As shown in FIG. 2D, the chip package 150 of the present invention mainly comprises a carrier 130, a plurality of bumps 112, a chip 100 and a plurality of supporting structures 122. The bumps 112 are disposed on the carrier 130. The chip 100 has an active surface 102 flip-chip bonded and electrically connected to the carrier 130 through the bumps 112. The supporting structures 122 are disposed around the junctions between the bumps 112 and the carrier 130.

In summary, the chip packaging process of the present invention includes forming a plurality of supporting structures around the junctions between the bumps and the carrier. Thus, without adding much complexity to the fabricating process, the bumps can have a higher tolerance for thermal stress and the electrical connection between the chip and the carrier can have a greater reliability. In the meantime, since the supporting structures can provide additional strength to the bumps to combat thermal stress, there is no need to increase the contact area between the bump and the carrier. Ultimately, the distance of separation between neighboring bumps can be reduced to increase the number of contacts between a chip and a carrier and produce a chip package with a higher packing density.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip packaging process, comprising the steps of:
   providing a chip having an active surface, wherein the active surface has a plurality of solder bumps disposed thereon;
   placing a polymer material on the surface of the solder bumps by a dipping process, wherein the polymer material includes flux;
   disposing the chip on a carrier, wherein the carrier is in contact with the solder bumps; and
   reflowing the solder bumps so that the chip connects electrically with the carrier through the solder bumps and the polymer material forms a plurality of supporting structures around junctions between the solder bumps and the carrier.

2. The chip packaging process of claim 1, wherein after reflowing the solderbumps, further comprises forming an underfill layer in a gap between the chip and the carrier.

3. The chip packaging process of claim 1, wherein after reflowing the solderbumps, further comprises curing the supporting structures.

4. The chip packaging process of claim 1, wherein the step of placing the polymer material on the surface of the solder bumps comprises:
   providing a vessel filled with the polymer material; and
   lowering the chip, with the active surface facing down, into the polymer material so that the polymer material is adhered to the surface of the solder bumps.

5. The chip packaging process of claim 1, wherein the shapes of the solder bumps comprise spherical shapes or cylindrical shapes.

6. The chip packaging process of claim 1, wherein the polymer material is placed on the top surfaces of the solder bumps.

7. The chip packaging process of claim 1, wherein after forming the supporting structures, further comprises forming an array of solder balls on a surface of the carrier away from the chip.

* * * * *